US010009011B1

(12) United States Patent
Kojima et al.

(10) Patent No.: US 10,009,011 B1
(45) Date of Patent: Jun. 26, 2018

(54) IMPEDANCE MATCHING CIRCUIT OF POWER AMPLIFIER

(71) Applicant: SAMSUNG ELECTRO-MECHANICS CO., LTD., Suwon-si (KR)

(72) Inventors: Masakazu Kojima, Suwon-si (KR); Yun Tae Nam, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/666,962

(22) Filed: Aug. 2, 2017

(30) Foreign Application Priority Data

Dec. 26, 2016 (KR) ........................ 10-2016-0179512

(51) Int. Cl.

| | |
|---|---|
| ***H03K 17/16*** | (2006.01) |
| ***H03K 19/003*** | (2006.01) |
| ***H03H 11/28*** | (2006.01) |
| ***H03F 3/213*** | (2006.01) |

(52) U.S. Cl.

CPC ............. *H03H 11/28* (2013.01); *H03F 3/213* (2013.01)

(58) Field of Classification Search

None

See application file for complete search history.

(56) References Cited

U.S. PATENT DOCUMENTS

| | | | | |
|---|---|---|---|---|
| 8,207,810 | B2 * | 6/2012 | Kawabata | H01F 17/0006 336/200 |
| 2010/0079211 | A1 | 4/2010 | Matsuda et al. | |
| 2010/0164645 | A1 * | 7/2010 | Kobayashi | H03F 1/565 333/32 |
| 2013/0154735 | A1 | 6/2013 | Hase | |

(Continued)

FOREIGN PATENT DOCUMENTS

| | | | |
|---|---|---|---|
| JP | 2001-267512 | A | 9/2001 |
| JP | 2001267512 | A * | 9/2001 |
| JP | 2010-87934 | A | 4/2010 |

(Continued)

OTHER PUBLICATIONS

Korean Office Action dated Dec. 15, 2017 in corresponding Korean patent application No. 10-2016-0179512 (7 pages in English and 6 pages in Korean).

*Primary Examiner* — Anh Tran

(74) *Attorney, Agent, or Firm* — NSIP Law

(57) ABSTRACT

An impedance matching circuit, includes a multilayer substrate, a microstrip line, a spiral inductor, a first capacitor circuit, and a second capacitor circuit. The multilayer substrate includes a power amplifier, and the microstrip line is disposed on a first layer substrate and connected to the power amplifier. The spiral inductor includes a first spiral transmission line disposed on the first layer substrate and connected to the microstrip line, a second spiral transmission line disposed on a substrate layer below the first layer substrate and connected to the first spiral transmission line, (Continued)

and an output pad disposed on the first layer substrate and connected to the second spiral transmission line. The first capacitor circuit is disposed outside the spiral inductor and connected between the microstrip line and a ground. The second capacitor circuit is disposed outside the spiral inductor and connected between the output pad and the ground.

19 Claims, 5 Drawing Sheets

(56) References Cited

U.S. PATENT DOCUMENTS

2013/0207730 A1 8/2013 Lee et al.
2015/0365057 A1* 12/2015 Kaczman ................ H03F 1/565
330/296

FOREIGN PATENT DOCUMENTS

| | | | |
|---|---|---|---|
| JP | 2013/131803 | A | 7/2013 |
| KR | 10-0541086 | B1 | 1/2006 |
| KR | 10-2012-0049341 | A | 5/2012 |
| KR | 10-2013-0093996 | A | 8/2013 |
| WO | WO 2011/022549 | A2 | 2/2011 |

* cited by examiner

IMPEDANCE MATCHING CIRCUIT OF POWER AMPLIFIER

CROSS-REFERENCE TO RELATED APPLICATION(S)

This application claims benefit under 35 USC 119(a) of priority to Korean Patent Application No. 10-2016-0179512 filed on Dec. 26, 2016 in the Korean Intellectual Property Office, the disclosure of which is incorporated herein by reference in its entirety.

BACKGROUND

1. Field

The following description relates to a high-performance and compact impedance matching circuit that may be connected to an output side of a power amplifier.

2. Description of Related Art

In general, mobile devices such as cellular phones include a power amplifier (PA) to amplify power of a transmission signal. The power amplifier (PA) requires an input matching circuit and an output matching circuit to match impedance.

Such an impedance matching circuit includes an inductance element and a capacitance element, in which the inductance element may be implemented as individual inductors or as a transmission line, such as a printed circuit board (PCB) pattern, and the capacitance element may be implemented as a capacitor.

When existing impedance matching circuits are configured to comprise capacitors and an inductor of a transmission line, and the transmission line is implemented on a single layer substrate, a transmission line having a length long enough to realize necessary inductance needs to be formed. As a result, the existing impedance matching circuit takes up a large area creating a problem of being able to miniaturize the impedance matching circuit.

SUMMARY

An aspect of the present disclosure may provide an impedance matching circuit of a power amplifier with a reduced size while maintaining a high performance.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided an impedance matching circuit, including: a multilayer substrate comprising a power amplifier; a microstrip line may be disposed on a first layer substrate and connected to the power amplifier; a spiral inductor comprising a first spiral transmission line may be disposed on the first layer substrate and connected to the microstrip line, a second spiral transmission line may be disposed on a substrate layer below the first layer substrate and connected to the first spiral transmission line, and an output pad may be disposed on the first layer substrate and connected to the second spiral transmission line; a first capacitor circuit may be disposed outside the spiral inductor and connected between the microstrip line and a ground; and a second capacitor circuit may be disposed outside the spiral inductor and connected between the output pad and the ground.

The impedance matching circuit may further include: a first reference ground may be disposed in the multilayer substrate and providing a reference potential of the microstrip line, wherein the microstrip line may include a lower characteristic impedance than upon the first reference ground being may be disposed on a lowermost layer of the multilayer substrate.

The second spiral transmission line may include: a first transmission line may be disposed on a second layer substrate, may be disposed under the first layer substrate and connected to the first spiral transmission line; a second transmission line may be disposed on a third layer substrate, may be disposed under the second layer substrate and connected to the first transmission line; and a third transmission line may be disposed on a fourth layer substrate, may be disposed under the third layer substrate and connected to the second transmission line, wherein the first spiral transmission line and the second spiral transmission line may be disposed in a spiral structure.

The microstrip line is connected to one end of the first spiral transmission line, the first transmission line may include one end connected to another end of the first spiral transmission line via a first conductor via, the second transmission line has one end connected to the other end of the first transmission line via a second conductor via, and the third transmission line may include one end connected to the other end of the second transmission line via a third conductor via and another end connected to the output pad via a fourth conductor via.

The first capacitor circuit may be connected directly to the microstrip line without a separate connection pad.

The first capacitor circuit may include: a first capacitor may be disposed on the first layer substrate and connected between the microstrip line and the ground; and a second capacitor may be disposed on the first layer substrate and connected to the first capacitor in parallel.

The second capacitor circuit may include: a third capacitor may be disposed on the first layer substrate and connected between the output pad and the ground; and a fourth capacitor may be disposed on the first layer substrate and connected to the third capacitor in parallel.

The impedance matching circuit may further include: a third capacitor circuit connected directly to the first spiral transmission line without a separate connection pad.

The impedance matching circuit may further include: a first reference ground may be disposed in the multilayer substrate and providing a reference potential of the microstrip line, and a second reference ground may be disposed in the multilayer substrate and providing a reference potential of the spiral inductor, wherein the first reference ground is may be disposed on a different layer from the second reference ground and the second reference ground is may be disposed on a lowermost layer of the multilayer substrate.

The impedance matching circuit may further include: a direct current (DC) blocking capacitor may be disposed on the first layer substrate and connected between the output pad of the spiral inductor and an output terminal.

In accordance with an embodiment, there is provided an impedance matching circuit, including: a multilayer substrate comprising a power amplifier; a microstrip line may be disposed on the multilayer substrate and connected to the power amplifier; a spiral inductor comprising a first spiral transmission line may be disposed on a first layer substrate of the multilayer substrate and connected to the microstrip line, a second spiral transmission line may be disposed on a substrate of a lower layer of the first layer substrate and connected to the first spiral transmission line, and an output pad may be disposed on the first layer substrate and connected to the second spiral transmission line; a first capacitor circuit may be disposed outside the spiral inductor and connected between the microstrip line and a ground; a second capacitor circuit may be disposed outside the spiral inductor and connected between the output pad and the ground; and a third capacitor circuit may be disposed outside the spiral inductor and connected between the first spiral transmission line and the ground.

The impedance matching circuit may further include: a first reference ground may be disposed in the multilayer substrate and providing a reference potential of the microstrip line, wherein the microstrip line may include a lower characteristic impedance than upon the first reference ground being may be disposed on a lowermost layer of the multilayer substrate.

The second spiral transmission line may include: a first transmission line may be disposed on a second layer substrate, may be disposed under the first layer substrate and connected to the first spiral transmission line; a second transmission line may be disposed on a third layer substrate, may be disposed under the second layer substrate and connected to the first transmission line; and a third transmission line may be disposed on a fourth layer substrate, may be disposed under the third layer substrate and connected to the second transmission line, wherein the first spiral transmission line and the second spiral transmission line may be disposed in a spiral structure.

The microstrip line may be connected to one end of the first spiral transmission line, the first transmission line may include one end connected to another end of the first spiral transmission line via a first conductor via, the second transmission line may have one end connected to the other end of the first transmission line via a second conductor via, and the third transmission line may include one end connected to the other end of the second transmission line via a third conductor via and another end connected to the output pad via a fourth conductor via.

The first capacitor circuit may include: a first capacitor may be disposed on the first layer substrate and connected between the microstrip line and the ground; and a second capacitor may be disposed on the first layer substrate and connected to the first capacitor in parallel.

The second capacitor circuit may include: a third capacitor may be disposed on the first layer substrate and connected between the output pad and the ground; and a fourth capacitor may be disposed on the first layer substrate and connected to the third capacitor in parallel.

The third capacitor circuit may include: a fifth capacitor may be disposed on the first layer substrate and connected between the first spiral transmission line and the ground; and a sixth capacitor may be disposed on the first layer substrate and connected to the fifth capacitor in parallel.

The impedance matching circuit may further include: a first reference ground may be disposed in the multilayer substrate and providing a reference potential of the microstrip line, and a second reference ground may be disposed in the multilayer substrate and providing a reference potential of the spiral inductor, wherein the first reference ground is may be disposed on a different layer from the second reference ground and the second reference ground is may be disposed on a lowermost layer of the multilayer substrate.

The impedance matching circuit may further include: a direct current (DC) blocking capacitor may be disposed on the first layer substrate and connected between the output pad of the spiral inductor and an output terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
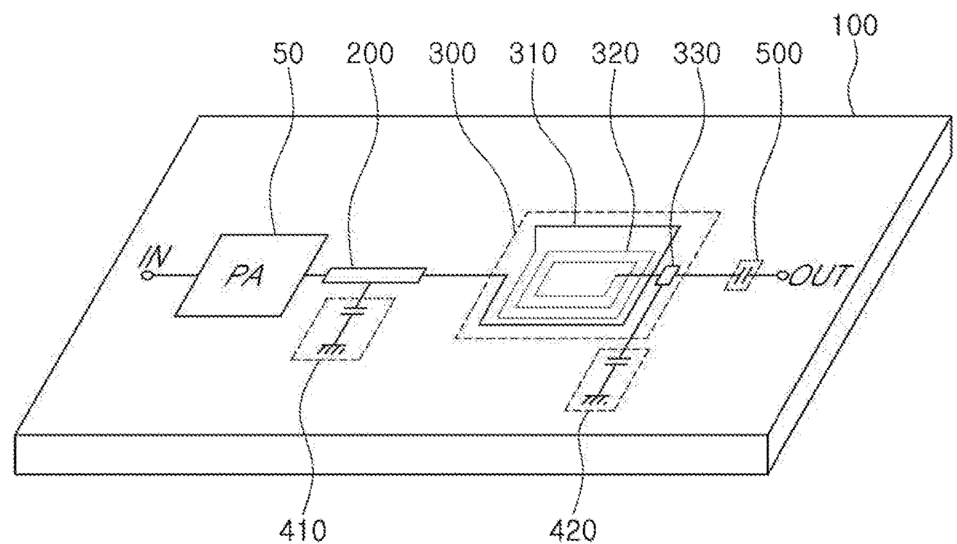
FIG. 1 is a diagram of an impedance matching circuit of a power amplifier, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "top," "bottom," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "top" or "upper" relative to another element will then be "below" or "lower" relative to the other element. Thus, the term "top" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
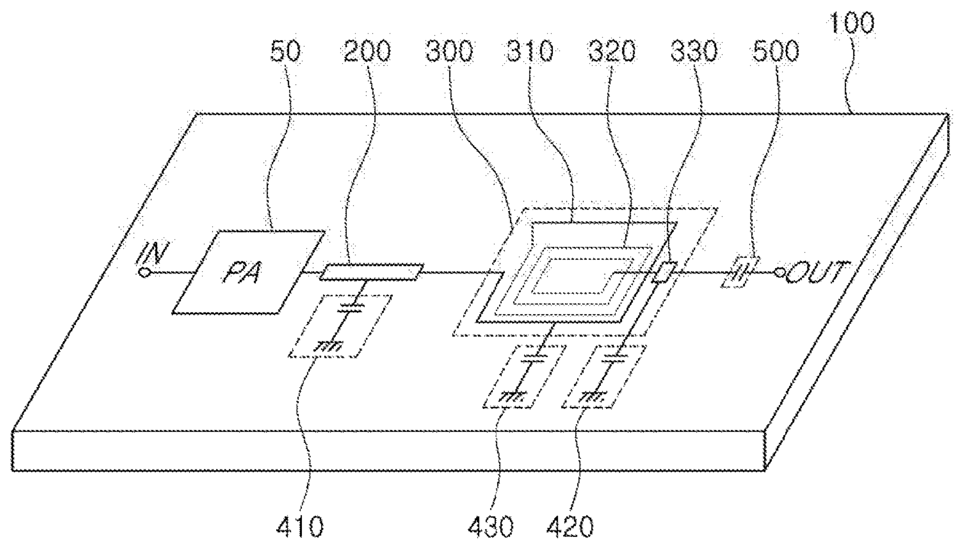
FIG. 2 is another diagram of an impedance matching circuit of a power amplifier, according to an embodiment.

FIG. 1 is a diagram of an impedance matching circuit of a power amplifier, according to an embodiment. FIG. 2 is another diagram of an impedance matching circuit of a power amplifier, according to an embodiment.

Referring to FIGS. 1 and 2, an impedance matching circuit of a power amplifier, according to an embodiment includes a multilayer substrate 100, a microstrip line 200, a spiral inductor 300, a first capacitor circuit 410, and a second capacitor circuit 420.

The multilayer substrate 100 includes a power amplifier 50, and has a multilayer structure in which a plurality of substrates are stacked. The multilayer substrate 100 includes, for example, a six-layer substrate, but is not limited thereto.

The microstrip line 200 is disposed on a first layer substrate 110 (FIG. 3) disposed on a top of the multilayer substrate 100 and connected to the power amplifier 50. For example, the microstrip line 200 is connected to the power amplifier 50 through wire bonding.

In addition, a reference ground (not shown) is disposed under or below the microstrip line 200, which will be described below.

The spiral inductor 300 includes a first spiral transmission line 310, a second spiral transmission line 320, and an output pad 330.

The first spiral transmission line 310 is disposed on the first layer substrate 110 and has one end connected to one end of the microstrip line 200. The second spiral transmission line 320 is disposed on at least one internal substrate of a lower layer of the first layer substrate 110 and has one end connected to another end of the first spiral transmission line 310 and another end connected to the output pad 330.

Further, the output pad 330 is disposed on the first layer substrate 110 and connected to another end of the second spiral transmission line 320.

The first spiral transmission line 310, the second spiral transmission line 320, and the output pad 330 are configured in a spiral structure, so that the spiral inductor 300 is compact.

The first capacitor circuit 410 outputs a capacitance for impedance matching, and is disposed outside the spiral inductor 300 of the first layer substrate 110 of the multilayer substrate 100, and connected between the microstrip line 200 and a ground.

The second capacitor circuit 420 outputs a capacitance for impedance matching, and is disposed outside the spiral inductor 300 of the first layer substrate 110 of the multilayer substrate 100, and connected between the output pad 330 and the ground.

In an example, the ground connected to the first capacitor circuit 410 and the second capacitor circuit 420 is formed on the first layer substrate 110, to connect the first capacitor circuit 410 and the second capacitor circuit 420.

In addition, the impedance matching circuit of the power amplifier includes a direct current (DC) blocking capacitor 500. The DC blocking capacitor 500 is disposed on the first layer substrate 110 of the multilayer substrate 100 and is connected between the output pad 330 of the spiral inductor 300 and an output terminal OUT. The DC blocking capacitor 500 blocks a direct current between the output pad 330 and the output terminal OUT.

The impedance matching circuit of the power amplifier (PA) 50 includes a first reference ground GND1 (FIG. 3), which is disposed inside the multilayer substrate 100 to provide a reference potential of the microstrip line 200. In this example, the microstrip line 200 has a lower characteristic impedance than in an example in which the first reference ground GND1 is disposed on a lowermost layer of the multilayer substrate 100.

Accordingly, the microstrip line 200 is disposed between the power amplifier 50 and the spiral inductor 300 to lower the output impedance of the power amplifier 50, such that the impedance matching between the power amplifier 50 and the spiral inductor 300 may be effective and facilitated.

In FIG. 1, IN is an input terminal of the power amplifier 50, and OUT is an output terminal of the DC blocking capacitor 500.

Referring to FIG. 2, the impedance matching circuit of the power amplifier also includes a third capacitor circuit 430.

The third capacitor circuit 430 is disposed outside the spiral inductor 300 of the first layer substrate 110 of the multilayer substrate 100, and is connected between the first spiral transmission line 310 and the ground.

In an example, the ground connected to the third capacitor circuit 430 is formed on the first layer substrate 110 to connect the third capacitor circuit 430.

As described above, the first capacitor circuit 410 is connected directly to the microstrip line 200 without a separate connection pad, and the third capacitor circuit 430 is connected directly to the first spiral transmission line 310 without a separate connection pad.

Accordingly, both the first capacitor circuit 410 and the third capacitor circuit 430 do not require a separate connection pad for the connection, which is further advantageous in miniaturization as reducing the number of structural elements in the multilayer substrate 100.

Furthermore, when an exterior of the spiral inductor 300 is defined, the spiral inductor 300 may refer to a center of the spiral structure, and portions of the spiral structure outside of the center thereof may correspond to the exterior of the spiral inductor 300.

As described above, because each of the first capacitor circuit 410, the second capacitor circuit 420, and the third capacitor circuit 430 is disposed outside the spiral inductor 300, the spiral inductor 300 forms a magnetic field without any hindrance, such that the performance of the spiral inductor 300 is improved, and the spiral inductor 300 has the multilayer spiral structure effectively achieving miniaturization.

Redundant explanation of components having the same reference numeral and function may be omitted, related to each drawing of the present description.

Figure 3:
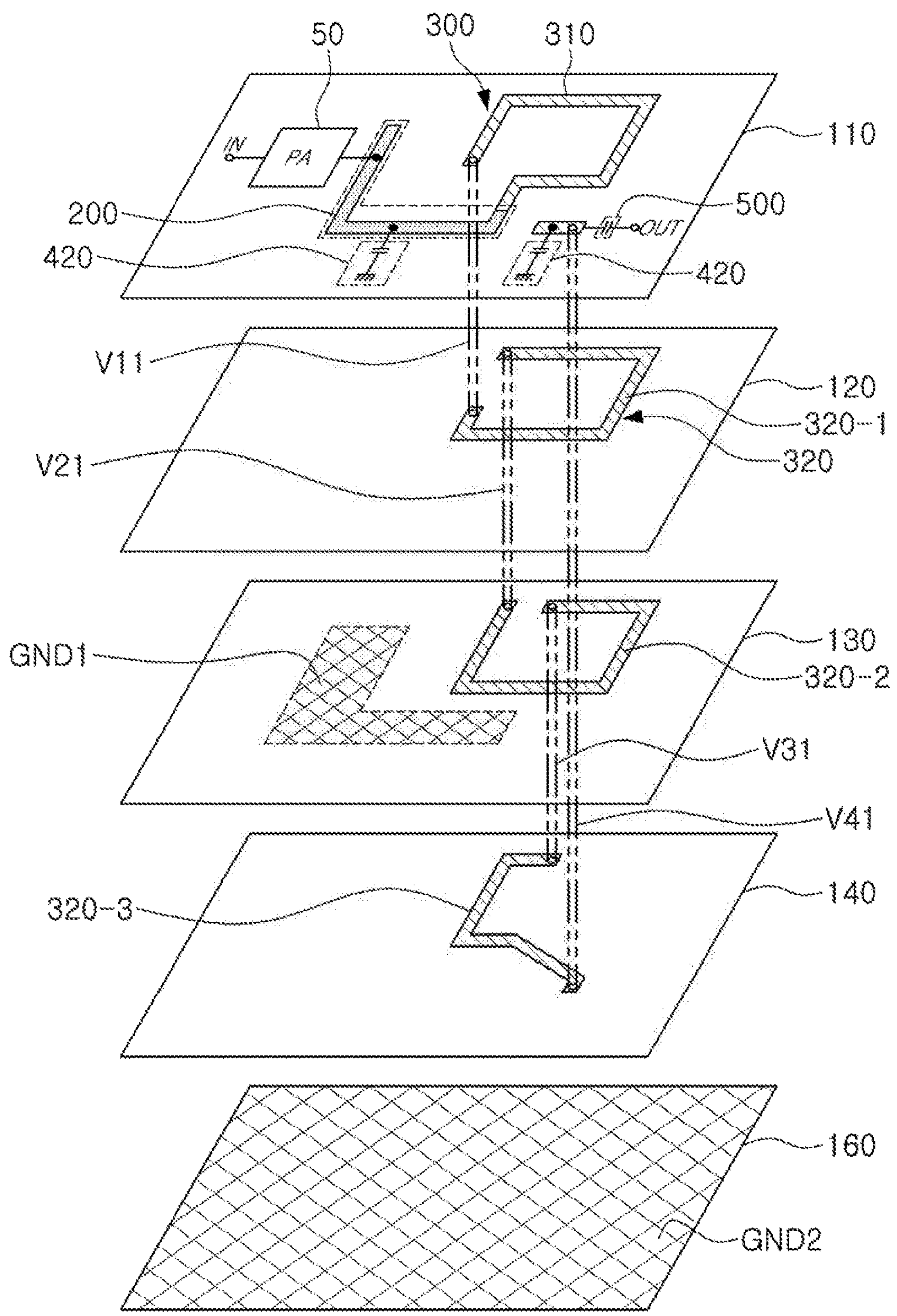
FIG. 3 is a diagram of a layer structure of the impedance matching circuit of the power amplifier, according to the embodiment.
Figure 4:
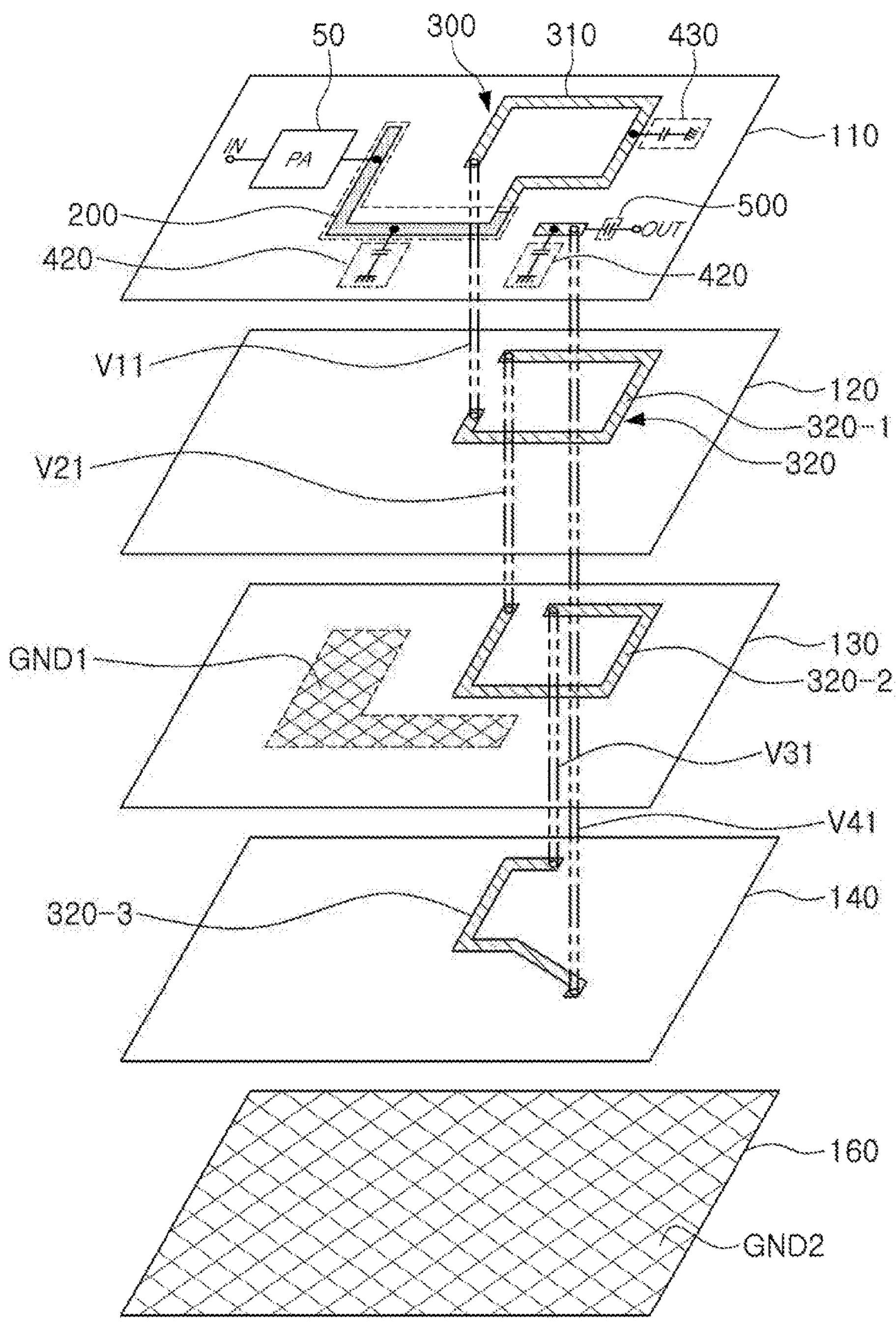
FIG. 4 is another diagram of the layer structure of the impedance matching circuit of the power amplifier, according to the embodiment.

FIG. 3 is a diagram of a layer structure of the impedance matching circuit of the power amplifier, according to an embodiment. FIG. 4 is another diagram of the layer structure of the impedance matching circuit of the power amplifier, according to an embodiment.

Referring to FIGS. 3 and 4, the second spiral transmission line 320 includes, for example, a first transmission line 320-1, a second transmission line 320-2, and a third transmission line 320-3.

The first transmission line 320-1 is disposed on a second layer substrate 120, which is disposed under the first layer substrate 110 of the multilayer substrate 100. The first transmission line 320-1 has one end connected to the other end of the first spiral transmission line 310 via a first conductor via V11.

The second transmission line 320-2 is disposed on a third layer substrate 130, which is disposed under the second layer substrate 120 of the multilayer substrate 100. The second transmission line 320-2 has one end connected to the other end of the first transmission line 320-1 via a second conductor via V21.

The third transmission line 320-3 is disposed on a fourth layer substrate 140, which is disposed under the third layer substrate 130 of the multilayer substrate 100. The third transmission line 320-3 has one end connected to the other end of the second transmission line 320-2 via a third conductor via V31 and the other end connected to the output pad 330 via a fourth conductor via V41.

In addition, the first spiral transmission line 310 and the second spiral transmission line 320 are arranged in a spiral structure. As described above, the spiral inductor 300 has the multilayer spiral structure and, therefore, may be miniaturized.

The impedance matching circuit of the power amplifier may further include a first reference ground GND1 and a second reference ground GND2.

The first reference ground GND1 is disposed in the multilayer substrate 100 to provide a reference potential of the microstrip line 200. The second reference ground GND2 is disposed in the multilayer substrate 100 to provide the reference potential of the spiral inductor 300.

Further, the first reference ground GND1 is disposed on a layer different from the second reference ground GND2 in the interior of the multilayer substrate 100. The second reference ground GND2 is disposed on the lowermost layer of the multilayer substrate 100.

As illustrated in FIGS. 3 and 4, in an example in which the multilayer substrate 100 has a six-layer structure, the first reference ground GND1 is disposed on the third layer substrate 130 of the multilayer substrate 100 and the second reference ground GND2 is disposed on the sixth layer of the substrate 160 of the multilayer substrate 100.

As described above, the microstrip line 200 has a lower characteristic impedance upon the first reference ground GND1 being disposed in the internal layer of the multilayer substrate 100 than an example in which the first reference ground GND1 is disposed on the lowermost layer of the multilayer substrate. Further, upon the second reference ground GND2 being disposed on the lowermost layer of the multilayer substrate 100 in the lower layer of the spiral inductor 300, a Q value of the spiral inductor 300 improves.

Figure 5:
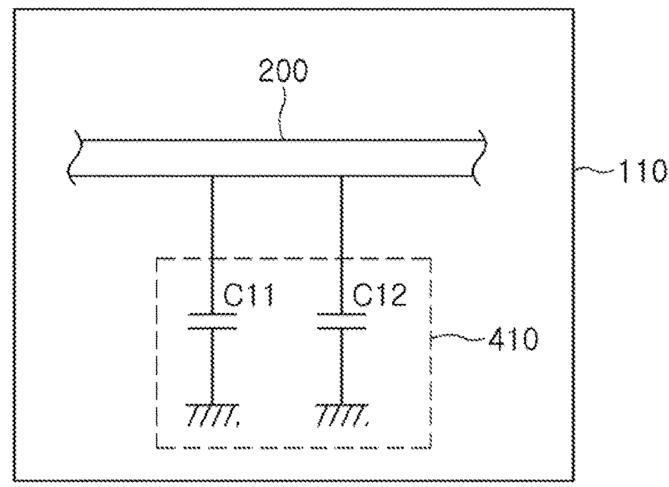
FIG. 5 is a diagram of a first capacitor circuit, according to an embodiment.

FIG. 5 is s diagram of a first capacitor circuit, according to an embodiment.

Referring to FIG. 5, the first capacitor circuit 410 includes a first capacitor C11 and a second capacitor C12.

The first capacitor C11 is disposed on the first layer substrate 110 of the multilayer substrate 100 and is connected between the microstrip line 200 and the ground.

The second capacitor C12 is disposed on the first layer substrate 110 of the multilayer substrate 100 and is connected to the first capacitor C11 in parallel.

As described above, as each of the first capacitor C11 and the second capacitor C12 is connected to each other in parallel, a larger capacitance is provided by the first capacitor C11 and the second capacitor C12 having a small capacitance, without a need to include a large capacitor having a large capacitance.

Figure 6:
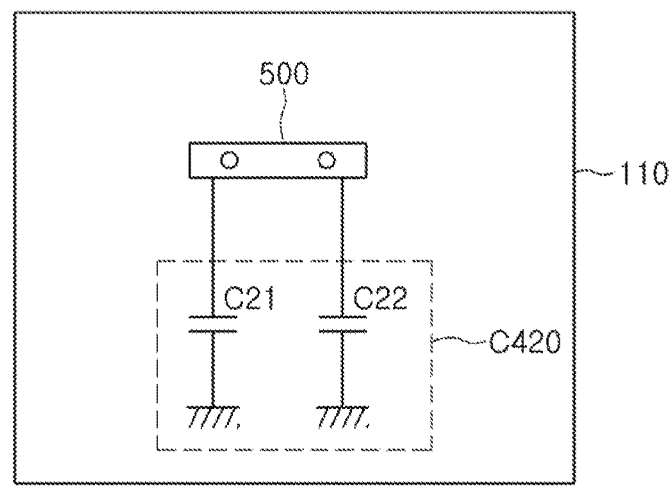
FIG. 6 is a diagram of a second capacitor circuit, according to an embodiment.

FIG. 6 is a diagram of a second capacitor circuit, according to an embodiment.

Referring to FIG. 6, the second capacitor circuit 420 includes a third capacitor C21 and a fourth capacitor C22.

The third capacitor C21 is disposed on the first layer substrate 110 of the multilayer substrate 100 and is connected between the output pad 330 and the ground.

The fourth capacitor C22 is disposed on the first layer substrate 110 of the multilayer substrate 100 and is connected to the third capacitor C21 in parallel.

In this way, as the third capacitor C21 and the fourth capacitor C22 are connected to each other in parallel, a larger capacitance may be provided by the third capacitor C21 and the fourth capacitor C22 having a small capacitance, without a need to include a large capacitor having a large capacitance.

Figure 7:
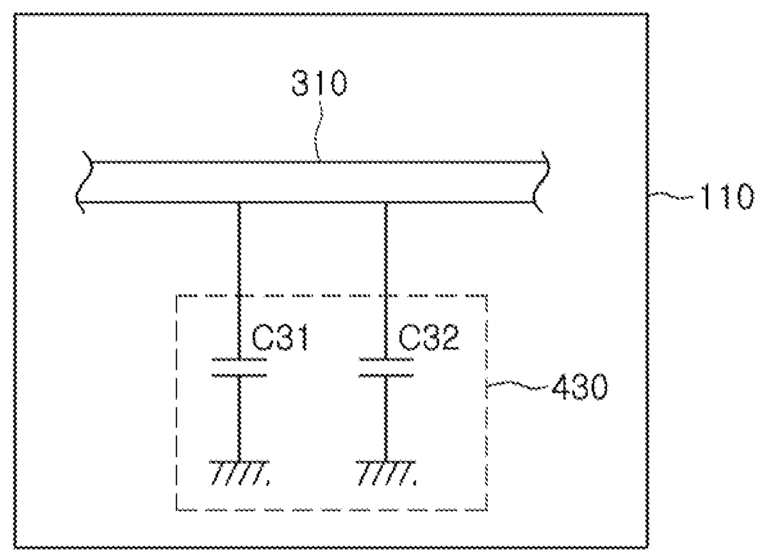
FIG. 7 is a diagram of a third capacitor circuit, according to an embodiment.

FIG. 7 is a diagram of a third capacitor circuit, according to an embodiment.

Referring to FIG. 7, the third capacitor circuit 430 includes a fifth capacitor C31 and a sixth capacitor C32.

The fifth capacitor C31 is disposed on the first layer substrate 110 of the multilayer substrate 100 and is connected between the first spiral transmission line 310 and the ground.

The sixth capacitor C32 is disposed on the first layer substrate 110 of the multilayer substrate 100 and is connected to the fifth capacitor C31 in parallel.

In this way, as the fifth capacitor C31 and the sixth capacitor C32 are connected to each other in parallel, a larger capacitance may be produced through a small capacitor having a small capacitance, without having to implement a large capacitor with a large capacitance.

In addition, the third capacitor circuit 430 is added by being connected to the spiral inductor 300 making it advantageous in the miniaturization of the spiral inductor 300 and the impedance matching.

As set forth above, according to embodiments, the impedance matching circuit has a reduced size while maintaining the high performance. For example, the six matched capacitors are laid out in a size of approximately 1.5×1.7 mm, and the Q value is increased by implementing the multilayer spiral inductor, such that the low loss is realized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An impedance matching circuit, comprising:

a multilayer substrate comprising a power amplifier;

a microstrip line disposed on a first layer substrate and connected to the power amplifier;

a spiral inductor comprising a first spiral transmission line disposed on the first layer substrate and connected to the microstrip line, a second spiral transmission line disposed on a substrate layer below the first layer substrate and connected to the first spiral transmission line, and an output pad disposed on the first layer substrate and connected to the second spiral transmission line;

a first capacitor circuit disposed outside the spiral inductor and connected between the microstrip line and a ground; and a second capacitor circuit disposed outside the spiral inductor and connected between the output pad and the ground.

2. The impedance matching circuit of claim 1, further comprising:

a first reference ground disposed in the multilayer substrate and providing a reference potential of the microstrip line, wherein the microstrip line comprises a lower characteristic impedance than upon the first reference ground being disposed on a lowermost layer of the multilayer substrate.

3. The impedance matching circuit of claim 1, wherein the second spiral transmission line comprises:

a first transmission line disposed on a second layer substrate, disposed under the first layer substrate and connected to the first spiral transmission line;

a second transmission line disposed on a third layer substrate, disposed under the second layer substrate and connected to the first transmission line; and a third transmission line disposed on a fourth layer substrate, disposed under the third layer substrate and connected to the second transmission line, wherein the first spiral transmission line and the second spiral transmission line are disposed in a spiral structure.

4. The impedance matching circuit of claim 3, wherein the microstrip line is connected to one end of the first spiral transmission line, the first transmission line comprises one end connected to another end of the first spiral transmission line via a first conductor via, the second transmission line has one end connected to the other end of the first transmission line via a second conductor via, and the third transmission line comprises one end connected to the other end of the second transmission line via a third conductor via and another end connected to the output pad via a fourth conductor via.

5. The impedance matching circuit of claim 1, wherein the first capacitor circuit is connected directly to the microstrip line without a separate connection pad.

6. The impedance matching circuit of claim 1, wherein the first capacitor circuit comprises:

a first capacitor disposed on the first layer substrate and connected between the microstrip line and the ground; and a second capacitor disposed on the first layer substrate and connected to the first capacitor in parallel.

7. The impedance matching circuit of claim 1, wherein the second capacitor circuit comprises:

a third capacitor disposed on the first layer substrate and connected between the output pad and the ground; and a fourth capacitor disposed on the first layer substrate and connected to the third capacitor in parallel.

8. The impedance matching circuit of claim 1, further comprising:

a third capacitor circuit connected directly to the first spiral transmission line without a separate connection pad.

9. The impedance matching circuit of claim 1, further comprising:

a first reference ground disposed in the multilayer substrate and providing a reference potential of the microstrip line, and a second reference ground disposed in the multilayer substrate and providing a reference potential of the spiral inductor, wherein the first reference ground is disposed on a different layer from the second reference ground and the second reference ground is disposed on a lowermost layer of the multilayer substrate.

10. The impedance matching circuit of claim 1, further comprising:

a direct current (DC) blocking capacitor disposed on the first layer substrate and connected between the output pad of the spiral inductor and an output terminal.

11. An impedance matching circuit, comprising:

a multilayer substrate comprising a power amplifier;

a microstrip line disposed on the multilayer substrate and connected to the power amplifier;

a spiral inductor comprising a first spiral transmission line disposed on a first layer substrate of the multilayer substrate and connected to the microstrip line, a second spiral transmission line disposed on a substrate of a lower layer of the first layer substrate and connected to the first spiral transmission line, and an output pad disposed on the first layer substrate and connected to the second spiral transmission line;

a first capacitor circuit disposed outside the spiral inductor and connected between the microstrip line and a ground;

a second capacitor circuit disposed outside the spiral inductor and connected between the output pad and the ground; and a third capacitor circuit disposed outside the spiral inductor and connected between the first spiral transmission line and the ground.

12. The impedance matching circuit of claim 11, further comprising:

a first reference ground disposed in the multilayer substrate and providing a reference potential of the microstrip line, wherein the microstrip line comprises a lower characteristic impedance than upon the first reference ground being disposed on a lowermost layer of the multilayer substrate.

13. The impedance matching circuit of claim 11, wherein the second spiral transmission line comprises:

a first transmission line disposed on a second layer substrate, disposed under the first layer substrate and connected to the first spiral transmission line;

a second transmission line disposed on a third layer substrate, disposed under the second layer substrate and connected to the first transmission line; and a third transmission line disposed on a fourth layer substrate, disposed under the third layer substrate and connected to the second transmission line, wherein the first spiral transmission line and the second spiral transmission line are disposed in a spiral structure.

14. The impedance matching circuit of claim 13, wherein the microstrip line is connected to one end of the first spiral transmission line, the first transmission line comprises one end connected to another end of the first spiral transmission line via a first conductor via, the second transmission line has one end connected to the other end of the first transmission line via a second conductor via, and the third transmission line comprises one end connected to the other end of the second transmission line via a third conductor via and another end connected to the output pad via a fourth conductor via.

15. The impedance matching circuit of claim 11, wherein the first capacitor circuit includes:

a first capacitor disposed on the first layer substrate and connected between the microstrip line and the ground; and a second capacitor disposed on the first layer substrate and connected to the first capacitor in parallel.

16. The impedance matching circuit of claim 11, wherein the second capacitor circuit includes:

a third capacitor disposed on the first layer substrate and connected between the output pad and the ground; and a fourth capacitor disposed on the first layer substrate and connected to the third capacitor in parallel.

17. The impedance matching circuit of claim 11, wherein the third capacitor circuit includes:

a fifth capacitor disposed on the first layer substrate and connected between the first spiral transmission line and the ground; and a sixth capacitor disposed on the first layer substrate and connected to the fifth capacitor in parallel.

18. The impedance matching circuit of claim 11, further comprising:

a first reference ground disposed in the multilayer substrate and providing a reference potential of the microstrip line, and a second reference ground disposed in the multilayer substrate and providing a reference potential of the spiral inductor, wherein the first reference ground is disposed on a different layer from the second reference ground and the second reference ground is disposed on a lowermost layer of the multilayer substrate.

19. The impedance matching circuit of claim 11, further comprising:

a direct current (DC) blocking capacitor disposed on the first layer substrate and connected between the output pad of the spiral inductor and an output terminal.

* * * * *